(12) United States Patent
Yugawa

(10) Patent No.: US 12,739,972 B2
(45) Date of Patent: Sep. 15, 2026

(54) WIRING BOARD

(71) Applicant: KYOCERA Corporation, Kyoto (JP)

(72) Inventor: Hidetoshi Yugawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 216 days.

(21) Appl. No.: 18/696,158

(22) PCT Filed: Sep. 22, 2022

(86) PCT No.: PCT/JP2022/035483

§ 371 (c)(1),
(2) Date: Mar. 27, 2024

(87) PCT Pub. No.: WO2023/054192

PCT Pub. Date: Apr. 6, 2023

(65) Prior Publication Data

US 2024/0407088 A1 Dec. 5, 2024

(30) Foreign Application Priority Data

Sep. 29, 2021 (JP) ................................ 2021-159898

(51) Int. Cl.
*H05K 1/03* (2006.01)

(52) U.S. Cl.
CPC ....... *H05K 1/03* (2013.01); *H05K 2201/0266* (2013.01)

(58) Field of Classification Search
CPC ................... H05K 1/03; H05K 1/0373; H05K 2201/0209; H05K 2201/0266; H05K 3/389; H05K 3/4676
USPC ......................................................... 174/250
See application file for complete search history.

(56) References Cited

U.S. PATENT DOCUMENTS

2009/0314526 A1* 12/2009 Nagasawa ............. H05K 3/381 174/262
2012/0301824 A1 11/2012 Yoshida et al.
2017/0094786 A1 3/2017 Oh et al.

FOREIGN PATENT DOCUMENTS

JP 2011-164305 A 8/2011
JP 2013033949 A 2/2013
KR 20040011155 A * 2/2004 ........... H05K 1/0373
KR 20170038535 A 4/2017

OTHER PUBLICATIONS

Silane Coupling Agents_Sivakumar et al._ pp. 1-13_May 2020.*

* cited by examiner

*Primary Examiner* — Timothy J Thompson
*Assistant Examiner* — Guillermo J Egoavil
(74) *Attorney, Agent, or Firm* — Volpe Koenig

(57) ABSTRACT

A wiring board according to the present disclosure includes a first insulation layer in which first insulating fillers are dispersed, and a second insulation layer located on an upper surface of the first insulation layer. The first insulation layer includes a protruding filler located protruding from the upper surface of the first insulation layer among the first insulating fillers and a coating film covering a part or all of a protruding surface of the protruding filler. The coating film has a structure in which a tin layer and a silane coupling agent layer are layered in this order. The second insulation layer covers the upper surface of the first insulation layer including the coating film.

9 Claims, 1 Drawing Sheet

WIRING BOARD

TECHNICAL FIELD

The present disclosure relates to a wiring board.

BACKGROUND OF INVENTION

Conventionally, insulating resin layers (a core layer and a build-up insulation layer) included in a wiring board are filled with insulating fillers such as silica fillers as described in, for example, Patent Document 1 for the purpose of achieving a low thermal expansion coefficient and a high density. In recent years, a filling rate of the insulating fillers has been increased, and as the filling rate of the insulating fillers increases, the amount of the insulating fillers exposed from the surface of the insulating resin layer increases. As a result, adhesiveness between the insulating fillers and the insulating resin is poor at a boundary surface between the insulating resin layers, which affects insulation reliability.

CITATION LIST

Patent Literature

Patent Document 1: JP 2011-164305 A

SUMMARY

Solution to Problem

A wiring board according to the present disclosure includes a first insulation layer in which first insulating fillers are dispersed, and a second insulation layer located on an upper surface of the first insulation layer. The first insulation layer includes a protruding filler located protruding from the upper surface of the first insulation layer among the first insulating fillers and a coating film covering a part or all of a protruding surface of the protruding filler. The coating film has a structure in which a tin layer and a silane coupling agent layer are layered in this order. The second insulation layer covers the upper surface of the first insulation layer including the coating film.

DESCRIPTION OF EMBODIMENTS

As described above, when the filling rate of the insulating fillers increases, the amount of the insulating fillers exposed from the surface of the insulating resin layer increases. As a result, the adhesiveness between the insulating fillers and the insulating resin is poor at the boundary surface between the insulating resin layers, which affects insulation reliability. Therefore, a wiring board is demanded that has excellent adhesiveness of an insulating resin layer layered on the surface of an insulating resin layer in which insulating fillers are dispersed and has excellent insulation reliability.

In the wiring board of the present disclosure, as described above, a specific coating film exists that covers a part of the protruding surface of the protruding filler located such that it protrudes from the upper surface of the first insulation layer. Due to the presence of such a specific coating film, the wiring board according to the present disclosure is excellent in adhesiveness of the insulating resin layer layered on the surface of the insulating resin layer in which the insulating fillers are dispersed and is excellent in insulation reliability.

Figure 1:
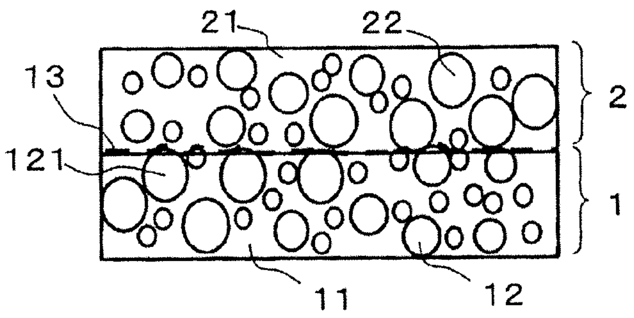
FIG. 1 is an enlarged explanatory view illustrating a main portion of a wiring board according to one embodiment of the present disclosure.

A wiring board according to an embodiment of the present disclosure will be described with reference to FIGS. 1 to 3. FIG. 1 is an enlarged explanatory view illustrating a main portion of the wiring board according to one embodiment of the present disclosure. As illustrated in FIG. 1, the wiring board according to one embodiment includes a first insulation layer 1 and a second insulation layer 2. Although not illustrated, an electrical conductor layer such as a wiring conductor layer made of a metal such as copper is present in a portion between the first insulation layer 1 and the second insulation layer 2.

As illustrated in FIG. 1, the first insulation layer 1 has a structure in which first insulating fillers 12 are dispersed in a first insulating resin 11. The first insulating resin 11 may be made of any material having an insulating property. Examples of the material having an insulating property include resins such as epoxy resin, bismaleimide-triazine resin, polyimide resin, polyphenylene ether resin, and liquid crystal polymer. Regarding the first insulating resin 11, a single kind may be used or two or more kinds may be used in combination. The first insulation layer 1 may be a core substrate having an insulating property of the wiring board. The core substrate may contain or need not contain glass fibers. The thickness of the first insulation layer 1 is not particularly limited, and is, for example, 10 μm or more and 20 mm or less in the case of a core substrate, and is 2 μm or more and 100 μm or less in the case of an insulation layer for layering.

The first insulating fillers 12 dispersed in the first insulating resin 11 have a function of reducing the thermal expansion coefficient of the first insulation layer 1. The first insulating fillers 12 are not limited, and examples thereof may include inorganic insulating fillers made of silica, alumina, barium sulfate, talc, clay, glass, calcium carbonate, and titanium oxide, or the like. Regarding the first insulating fillers 12, a single kind may be used or two or more kinds may be used in combination.

An average particle diameter of the first insulating fillers 12 is not limited. In order to increase the filling rate of the first insulating fillers 12, the first insulating fillers 12 preferably have a plurality of kinds of average particle diameters. The first insulating fillers 12 may have an average particle diameter of, for example, 0.1 μm or more and 1 μm or less. The filling rate of the first insulating fillers 12 in the first insulation layer 1 is not limited. In order to sufficiently reduce the thermal expansion coefficient of the first insulation layer 1, the filling rate of the first insulating fillers 12 in the first insulation layer 1 may be 50 mass % or more and 90 mass % or less. The average particle diameter may be measured by, for example, X-ray CT analysis. The filling rate may be detected by energy dispersive X-ray analysis.

The first insulating fillers 12 include a protruding filler 121 located such that it protrudes from the upper surface of the first insulation layer 1. As illustrated in FIGS. 2 and 3, a part of the protruding surface of the protruding filler 121 is coated with a coating film 13. FIG. 2 is an explanatory view illustrating a state in which the first insulation layer 1 and the second insulation layer 2 are separated from each other in FIG. 1. FIG. 3 is an electron microscope image showing a main portion of the wiring board according to one embodiment. The coating film 13 may cover the entire protruding surface of the protruding filler 121.

The tin layer has a function of allowing the silane coupling agent layer to stably adhere to the surface of the protruding filler 121, and contains tin and tin oxide. When tin is oxidized, insulation resistance is increased, and thus, compared to a case where tin is not oxidized, for example, insulation reliability between wiring conductors adjacent to each other can be improved. The thickness of the tin layer is not limited. The tin layer has a thickness of, for example, 2 nm or more and 5 nm or less. When the tin layer is present, tin and tin oxide, for example, are detected by time-of-flight secondary ion mass spectrometry (TOF-SIMS) described later. The thickness of the tin layer can be measured by transmission electron microscope observation.

The silane coupling agent layer is located covering the tin layer. The silane coupling agent is a compound containing, in the molecule, a functional group that reacts with an inorganic material and a functional group that reacts with an organic material. Therefore, for example, the presence of the silane coupling agent layer having a molecular structure including a functional group that reacts with and is connected to the protruding filler 121 and the electrical conductor layer that are inorganic materials and a functional group that reacts with and is connected to the second insulation layer 2 that is an organic material can improve the adhesion (adhesiveness) between the first insulating fillers 12 and the second insulating resin 21 included in the second insulation layer 2. The thickness of the silane coupling agent layer is not limited. The silane coupling agent layer has, for example, a thickness of 15 nm or less and may be thicker than the tin layer.

The presence or absence of the silane coupling agent layer can be confirmed, for example, by performing mass analysis using the time-of-flight secondary ion mass spectrometry (TOF-SIMS) or by analyzing the above functional group structure using Fourier transform infrared spectroscopy (FTIR). TOF-SIMS is a surface analysis method for performing qualitative analysis of elements and molecules present on the very surface. Specifically, when a solid sample is irradiated with a focused ion beam in an ultra-high vacuum, neutral particles and secondary ions are released into the vacuum due to a sputtering phenomenon. The constituent elements of the sample surface are analyzed by precisely measuring the flight time until the secondary ions reach the detector. When the silane coupling agent layer is present, polydimethylsiloxane, for example, is detected by TOF-SIMS.

Figure 2:
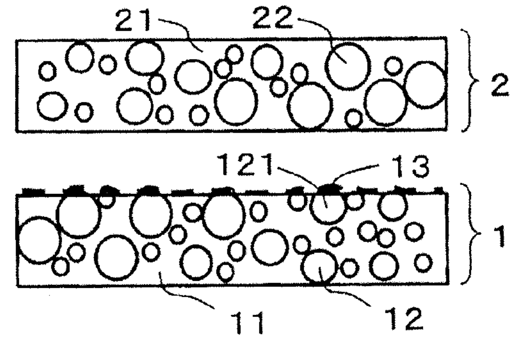
FIG. 2 is an explanatory view illustrating a state in which the first insulation layer and the second insulation layer are separated from each other in FIG. 1.
Figure 3:
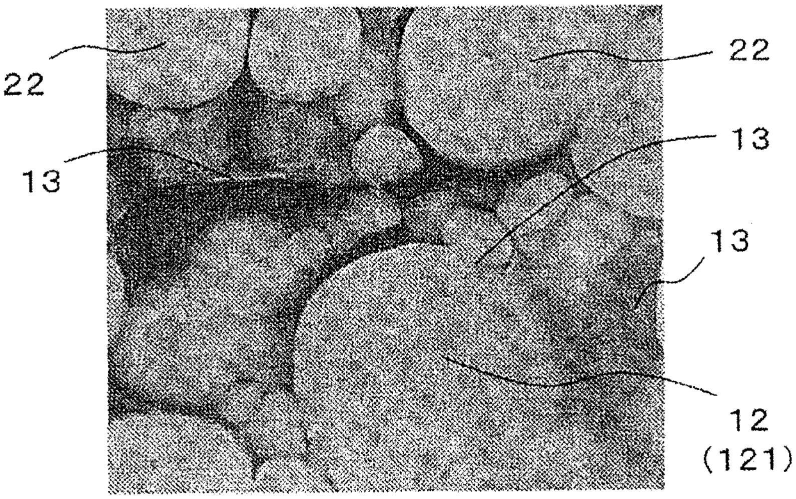
FIG. 3 is an electron microscope image showing a main portion of the wiring board according to one embodiment of the present disclosure.

The coating film 13 may not only cover a part of the protruding surface of the protruding filler 121 but also be located at a part other than the protruding filler 121 on the upper surface of the first insulation layer 1 as illustrated in FIG. 2. Since the coating film 13 is thus also located on a part other than the protruding filler 121, the adhesiveness of the second insulation layer 2 layered on the surface of the first insulation layer 1 can be further improved.

The proportion of the coating film 13 on the upper surface of the first insulation layer 1 is not limited. In a plane perspective, the proportion of the coating film 13 on the upper surface of the first insulation layer 1 may be, for example, 40% or more and 80% or less. When the proportion of the coating film 13 is 40% or more and 80% or less, excellent adhesiveness can be exhibited and excellent insulation reliability can also be maintained.

The second insulation layer 2 is located on the upper surface of the first insulation layer 1. As illustrated in FIG. 1, the second insulation layer 2 has a structure in which second insulating fillers 22 are dispersed in the second insulating resin 21. As with the first insulating resin 11, the second insulating resin 21 is not particularly limited as long as the second insulating resin 21 is made of a material having an insulating property. Examples of the material having an insulating property include resins such as epoxy resin, bismaleimide-triazine resin, polyimide resin, polyphenylene ether resin, and liquid crystal polymer. The second insulating resin 21 may be the same resin as the first insulating resin 11 or a different resin. Regarding the second insulating resin 21, a single kind may be used or two or more kinds may be used in combination. The thickness of the second insulation layer 2 is not particularly limited and is, for example, 2 μm or more and 100 μm or less.

The second insulating fillers 22 dispersed in the second insulating resin 21 have a function of reducing the thermal expansion coefficient of the second insulation layer 2. The second insulating fillers 22 are not limited, and as with the first insulating fillers 12, examples thereof may include inorganic insulating fillers made of silica, alumina, barium sulfate, talc, clay, glass, calcium carbonate, titanium oxide, or the like. The second insulating fillers 22 may be the same insulating fillers as the first insulating fillers 12 or may be different insulating fillers. Regarding the second insulating fillers 22, a single kind may be used or two or more kinds may be used in combination.

The average particle diameter of the second insulating fillers 22 is not limited. In order to increase the filling rate of the second insulating fillers 22, the second insulating fillers 22 preferably have a plurality of kinds of average particle diameters. The second insulating fillers 22 may have an average particle diameter of, for example, 0.1 μm or more and 1 μm or less. The filling rate of the second insulating fillers 22 in the second insulation layer 2 is not limited. In order to sufficiently reduce the thermal expansion coefficient of the second insulation layer 2, the filling rate of the second insulating fillers 22 in the second insulation layer 2 may be 50 mass % or more and 90 mass % or less. The methods for calculating the average particle diameter and the filling rate are as described above.

A method for forming the coating film 13 on the surface of the first insulation layer 1 in the wiring board according to one embodiment is not limited, and the coating film 13 is formed by, for example, the following procedure. First, a resin film formed of the first insulating resin 11 in which the first insulating fillers 12 are dispersed is prepared. This resin film (resin plate) is a precursor of the first insulation layer 1. Hereinafter, a case where the first insulation layer 1 is a core layer will be described.

Next, a through hole is formed in the resin film as necessary. The through hole is formed, for example, by drilling, blasting, or laser processing. When the first insulation layer 1 is a build-up insulation layer, a via hole is formed instead of the through hole. Next, a desmear treatment is performed, and a seed layer is made of a metal such as copper on the surface of the resin film and the inner wall surface of the through hole by electroless plating. Next, a resist is formed on the surface of the resin film, and exposure and development are performed. Next, a metal such as copper is formed on the surface of the resin film of the through hole and the inner wall surface of the through hole by electrolytic plating. Thereafter, the resist is peeled off and the seed layer is also removed.

Next, a metal oxide film such as an oxide film of copper is removed by acid cleaning. Thereafter, tin is precipitated to have a thickness of about 100 nm by tin plating on the protruding surface of the protruding filler 121 protruding from the upper surface of the resin film and on the portions other than the protruding filler 121.

Next, excessively precipitated tin is removed, for example by etching with nitric acid. The etching is performed in this manner to adjust the tin thickness to about 2 nm or more and 5 nm or less. Since the amount of tin precipitated on copper is larger than that on the protruding filler 121, the thickness of the tin thickness is adjusted to about 10 nm or more and 20 nm or less by etching with nitric acid. In order to adjust the tin thickness of 100 nm to about 2 nm or more and 5 nm or less, immersion in nitric acid may be performed for about 2 seconds or more and 90 seconds or less. The thickness of the tin layer can be adjusted by adjusting the time of immersion in nitric acid.

Next, the silane coupling agent is applied covering the formed tin layer. As the silane coupling agent, a commercially available product such as FC-9100Z (manufactured by MEC COMPANY LTD.), KBM-303 (manufactured by Shin-Etsu Chemical Co., Ltd.), or DOWSIL™ Z-6040 Silane (manufactured by Dow Toray Co., Ltd.) can be used. After applying the silane coupling agent, treatment is performed at a temperature of 70° C. or more and 100° C. or less for 1 minute or more and 10 minutes or less, so that a silane coupling agent layer is formed on the surface of the tin layer. As described above, the silane coupling agent layer is not thicker than 15 nm, and may be thicker than the tin layer. The thickness of the silane coupling agent layer can be adjusted by adjusting heating temperature or heating time.

In this way, a wiring board having excellent adhesiveness between insulation layers can be manufactured. The bonding may be between the core layer and the build-up insulation layer or between the build-up insulation layers as long as it is between the insulation layers. In the present description, the terms "first insulation layer" and "second insulation layer" are used for convenience, and the "first insulation layer" is not limited to the core layer. For example, both of the "first insulation layer" and the "second insulation layer" may be build-up insulation layers.

Since FIG. 1 is an enlarged explanatory view illustrating a main portion of the wiring board 1 according to one embodiment, FIG. 1 illustrates only two insulation layers. However, the wiring board of the present disclosure may have a structure in which three or more insulation layers are layered. When the wiring board has a structure in which three or more insulation layers are layered, the lower insulation layer of two adjacent insulation layers may be regarded as a "first insulation layer", and the upper insulation layer may be regarded as a "second insulation layer".

In the wiring board 1 according to the above-described embodiment, the second insulating fillers 22 are dispersed in the second insulation layer 2. However, in the wiring board according to the present disclosure, insulating fillers need not be present in the second insulation layer 2.

In the wiring board 1 according to the above-described embodiment, the coating film 13 is also located on a part of the upper surface of the first insulation layer 1 other than the protruding filler 121. However, in the wiring board according to the present disclosure, the coating film may cover only a part of the protruding surface of the protruding filler 121.

REFERENCE SIGNS

1 First insulation layer
11 First insulating resin
12 First insulating filler
121 Protruding filler
13 Coating film
2 Second insulation layer
21 Second insulating resin
22 Second insulating filler

The invention claimed is:

1. A wiring board comprising:
a first insulation layer in which a plurality of first insulating fillers are dispersed in the first insulating layer; and
a second insulation layer located on an upper surface of the first insulation layer, wherein
the first insulation layer comprises a protruding filler among the plurality of first insulating fillers, the protruding filler located protruding from the upper surface of the first insulation layer, and a coating film covering a part or all of a protruding surface of the protruding filler,
the coating film has a structure in which a tin layer and a silane coupling agent layer are layered in this order from the surface of the protruding filler, and
the second insulation layer covers the upper surface of the first insulation layer comprising the coating film.

2. The wiring board according to claim 1, wherein
in a plane perspective, a proportion of the coating film on the upper surface of the first insulation layer is 40% or more and 80% or less.

3. The wiring board according to claim 1, wherein
the plurality of first insulating fillers have an average particle diameter of 0.1 μm or more and 1 μm or less.

4. The wiring board according to claim 1, wherein
a filling rate of the plurality of first insulating fillers in the first insulation layer is 50 mass % or more and 90 mass % or less.

5. The wiring board according to claim 1, wherein
the tin layer has a thickness of 2 nm or more and 5 nm or less.

6. The wiring board according to claim 1, wherein
the silane coupling agent layer has a thickness of 15 nm or less and is thicker than the tin layer.

7. A wiring board comprising:
a first insulation layer in which a plurality of first insulating fillers are dispersed in the first insulating layer; and
a second insulation layer located on an upper surface of the first insulation layer, wherein
the first insulation layer comprises a protruding filler among the plurality of first insulating fillers, the protruding filler located protruding from the upper surface of the first insulation layer, and a coating film covering a part or all of a protruding surface of the protruding filler,
the coating film has a structure in which a tin layer and a silane coupling agent layer are layered in this order from the surface of the protruding filler,
the second insulation layer covers the upper surface of the first insulation layer comprising the coating film,
the coating film is also located on a part of the upper surface of the first insulation layer other than the protruding filler, and
the coating film located on the part of the upper surface of the first insulation layer other than the protruding filler has a structure in which the tin layer and the silane coupling agent layer are layered in this order from the upper surface of the first insulation layer.

8. The wiring board according to claim 7, wherein second insulating fillers are dispersed in the second insulation layer.

9. The wiring board according to claim 7, wherein the tin layer is oxidized.

* * * * *